US011410936B2

(12) United States Patent
Lin et al.

(10) Patent No.: US 11,410,936 B2
(45) Date of Patent: *Aug. 9, 2022

(54) SEMICONDUCTOR PACKAGE STRUCTURE (71) Applicant: MEDIATEK INC., Hsinchu (TW)

(72) Inventors: Tzu-Hung Lin, Zhubei (TW);
Chia-Cheng Chang, Hsinchu (TW);
I-Hsuan Peng, Hsinchu (TW); Nai-Wei Liu, Kaohsiung (TW)

(73) Assignee: MEDIATEK INC., Hsinchu (TW)

( * ) Notice: Subject to any disclaimer, the term of this patent is extended or adjusted under 35 U.S.C. 154(b) by 50 days.

This patent is subject to a terminal disclaimer.

(21) Appl. No.: 16/983,182

(22) Filed: Aug. 3, 2020

(65) Prior Publication Data

US 2020/0365526 A1 Nov. 19, 2020

Related U.S. Application Data (63) Continuation of application No. 15/906,098, filed on Feb. 27, 2018, now Pat. No. 10,784,211.

(Continued)

(51) Int. Cl.
*H01L 23/00* (2006.01)
*H01L 23/498* (2006.01)
(Continued)

(52) U.S. Cl.
CPC .......... *H01L 23/562* (2013.01); *H01L 23/043* (2013.01); *H01L 23/13* (2013.01);
(Continued)

(58) Field of Classification Search
None
See application file for complete search history.

(56) References Cited

U.S. PATENT DOCUMENTS 5,841,194 A 11/1998 Tsukamoto
6,020,221 A 2/2000 Lim et al.
(Continued)

FOREIGN PATENT DOCUMENTS

CN 1163480 A 10/1997
CN 102110660 A 6/2011
(Continued)

OTHER PUBLICATIONS

Chinese language office action dated Mar. 31, 2021, issued in application No. TW 108145283.
(Continued)

*Primary Examiner* — Long Pham
(74) *Attorney, Agent, or Firm* — McClure, Qualey & Rodack, LLP (57) ABSTRACT A semiconductor package structure is provided. The semiconductor package structure includes a substrate having a first surface and a second surface opposite thereto, wherein the substrate includes a wiring structure, and a first semiconductor die disposed over the first surface of the substrate and electrically coupled to the wiring structure. The package further includes a second semiconductor die disposed over the first surface of the substrate and electrically coupled to the wiring structure, wherein the first semiconductor die and the second semiconductor die are separated by a molding material. A first hole and a second hole are formed on the second surface of the substrate. Finally, a frame is disposed over the first surface of the substrate, wherein the frame surrounds the first semiconductor die and the second semiconductor die.

10 Claims, 6 Drawing Sheets

Related U.S. Application Data (60) Provisional application No. 62/470,915, filed on Mar. 14, 2017.

(51) Int. Cl.
*H01L 23/31* (2006.01)
*H01L 25/065* (2006.01)
*H01L 23/043* (2006.01)
*H01L 23/13* (2006.01)
*H01L 23/538* (2006.01)

(52) U.S. Cl.
CPC .... *H01L 23/3135* (2013.01); *H01L 23/49816* (2013.01); *H01L 23/49838* (2013.01); *H01L 23/5383* (2013.01); *H01L 24/16* (2013.01); *H01L 25/0655* (2013.01); *H01L 23/5385* (2013.01); *H01L 2224/16227* (2013.01)

(56) References Cited

U.S. PATENT DOCUMENTS

| | | | |
|---|---|---|---|
| 8,247,900 B2 | 8/2012 | Yuan | |
| 8,710,629 B2 | 4/2014 | Bai et al. | |
| 9,209,048 B2 | 12/2015 | Huang et al. | |
| 9,412,662 B2 | 8/2016 | Lin et al. | |
| 9,425,171 B1 | 8/2016 | Minacapelli et al. | |
| 9,543,249 B1 | 1/2017 | Hu | |
| 10,529,645 B2 | 1/2020 | Gandhi et al. | |
| 10,784,211 B2 * | 9/2020 | Lin | H01L 23/13 |
| 2001/0017408 A1 | 8/2001 | Baba | |
| 2002/0011907 A1 | 1/2002 | Yamada et al. | |
| 2004/0150118 A1 | 8/2004 | Honda | |
| 2005/0186769 A1 | 8/2005 | Young | |
| 2007/0001278 A1 | 1/2007 | Jeon et al. | |
| 2007/0069366 A1 | 3/2007 | Chang et al. | |
| 2007/0194464 A1 | 8/2007 | Fukuzono | |
| 2008/0054490 A1 | 3/2008 | McLellan et al. | |
| 2008/0179725 A1 | 7/2008 | Chia et al. | |
| 2008/0237840 A1 | 10/2008 | Alcoe et al. | |
| 2008/0258293 A1 | 10/2008 | Yang et al. | |
| 2009/0236730 A1 | 9/2009 | Topacio et al. | |
| 2010/0276799 A1 | 11/2010 | Heng et al. | |
| 2011/0156235 A1 | 6/2011 | Yuan | |
| 2012/0018871 A1 | 1/2012 | Lee et al. | |
| 2012/0182694 A1 | 7/2012 | Lin et al. | |
| 2012/0188721 A1 | 7/2012 | Ho et al. | |
| 2013/0234304 A1 | 9/2013 | Tamaki | |
| 2014/0070423 A1 | 3/2014 | Woychik et al. | |
| 2015/0187737 A1 | 7/2015 | Lin et al. | |
| 2015/0260929 A1 | 9/2015 | Matsumaru et al. | |
| 2016/0351467 A1 | 12/2016 | Li | |
| 2017/0018510 A1 | 1/2017 | Shen et al. | |
| 2018/0138127 A1 | 5/2018 | Lee et al. | |
| 2018/0175001 A1 | 6/2018 | Pyo et al. | |
| 2018/0204807 A1 | 7/2018 | Aizawa | |
| 2018/0237840 A1 | 8/2018 | Marggraf-Rogalla et al. | |
| 2018/0269164 A1 | 9/2018 | Lin et al. | |
| 2018/0350772 A1 | 12/2018 | Nair et al. | |
| 2018/0374820 A1 | 12/2018 | Ko et al. | |
| 2019/0115269 A1 | 4/2019 | Pan et al. | |

FOREIGN PATENT DOCUMENTS

| | | |
|---|---|---|
| CN | 201936868 U | 8/2011 |
| CN | 103038877 A | 4/2013 |
| CN | 103066029 A | 4/2013 |
| CN | 203659838 U | 6/2014 |
| DE | 198 30 158 A1 | 4/1999 |
| DE | 10 2013 200 518 A | 7/2013 |
| EP | 0 797 253 A2 | 9/1997 |
| EP | 2 066 160 A2 | 6/2009 |
| EP | 3 376 535 A1 | 9/2018 |
| JP | 2003-017625 A | 1/2003 |
| JP | 2004-247464 A | 9/2004 |
| KR | 10-2008-0093909 A | 10/2008 |
| TW | 201546954 A | 12/2015 |
| TW | 201608653 A | 3/2016 |
| TW | 201705414 A | 2/2017 |
| TW | M563659 U | 7/2018 |
| TW | 201834164 A | 9/2018 |
| TW | M572570 U | 1/2019 |
| WO | 2013/119309 A1 | 8/2013 |

OTHER PUBLICATIONS

European Search Report dated May 6, 2020, issued in application No. EP 19213567.1.
Chinese language office action dated May 7, 2020, issued in application No. CN 201810189557.2.
European Search Report dated May 27, 2020, issued in application No. EP 20162559.7.
Chinese language office action dated Jun. 19, 2020, issued in application TW 109108155.
Chinese language office action dated Jun. 2, 2021, issued in application No. CN 201911261556.5.
Chinese language office action dated Sep. 14, 2021, issued in application No. TW 108145283.
Non-Final Office Action dated Oct. 21, 2020, issued in application No. U.S. Appl. No. 16/563,919.
European Search Report dated Nov. 13, 2020, issued in application No. EP 20178978.1.
Chinese language office action dated Jan. 13, 2021, issued in application No. TW 109120165.

* cited by examiner

SEMICONDUCTOR PACKAGE STRUCTURE

CROSS REFERENCE TO RELATED APPLICATIONS

This application is a Continuation of U.S. application Ser. No. 15/906,098, filed on Feb. 27, 2018, now U.S. Pat. No. 10,784,211, which claims the benefit of U.S. Provisional Application No. 62/470,915 filed on Mar. 14, 2017, the entirety of which is incorporated by reference herein.

BACKGROUND OF THE INVENTION

Field of the Invention

The present invention relates to a semiconductor package structure, and in particular to a semiconductor package structure with holes formed on a top surface of a substrate therein.

Description of the Related Art

A semiconductor package can not only provide a semiconductor die with protection from environmental contaminants, but it can also provide an electrical connection between the semiconductor die packaged therein and a substrate, such as a printed circuit board (PCB). For instance, a semiconductor die may be enclosed in an encapsulating material, and traces are electrically connected to the semiconductor die and the substrate.

However, a problem with such a semiconductor package is that it is subject to different temperatures during the packaging process. The semiconductor package may be highly stressed due to the different coefficients of thermal expansion (CTEs) of the various substrate and semiconductor die materials. As a result, the semiconductor package may exhibit warping or cracking so that the electrical connection between the semiconductor die and the substrate may be damaged, and the reliability of the semiconductor package may be decreased.

This problem is exacerbated in the case of a relatively large package, for example a package of 50 mm×50 mm or larger. Therefore, a novel semiconductor package structure is desirable.

BRIEF SUMMARY OF THE INVENTION

Semiconductor package structures are provided. An exemplary embodiment of a semiconductor package structure includes a substrate having a first surface and a second surface opposite thereto. The substrate includes a wiring structure. The semiconductor package structure also includes a first semiconductor die disposed over the first surface of the substrate and electrically coupled to the wiring structure. The semiconductor package structure further includes a second semiconductor die disposed over the first surface of the substrate and electrically coupled to the wiring structure. The first semiconductor die and the second semiconductor die are separated by a molding material. In addition, the semiconductor package structure includes a first hole and a second hole formed on the second surface of the substrate.

Another exemplary embodiment of a semiconductor package structure includes a substrate having a wiring structure. The semiconductor package structure also includes a first semiconductor die disposed over the substrate and electrically coupled to the wiring structure. The semiconductor package structure further includes a second semiconductor die disposed over the substrate and electrically coupled to the wiring structure. The first semiconductor die and the second semiconductor die are arranged side-by-side. In addition, the semiconductor package structure includes a plurality of holes formed on a surface of the substrate. The holes are located within projections of the first semiconductor die and the second semiconductor die on the substrate.

Yet another exemplary embodiment of a substrate structure includes a wiring structure disposed in a substrate, wherein the wiring structure is coupled to a plurality of semiconductor dies disposed over the substrate. The substrate structure also includes a plurality of holes formed on a surface of the substrate, wherein the holes are located within projections of the semiconductor die on the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1C is a plane view of an arrangement of holes in a substrate of the semiconductor package structure shown in FIG. 1A, and FIG. 1A is a cross-sectional view of the semiconductor package structure along line I-I' of FIG. 1C;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1A:
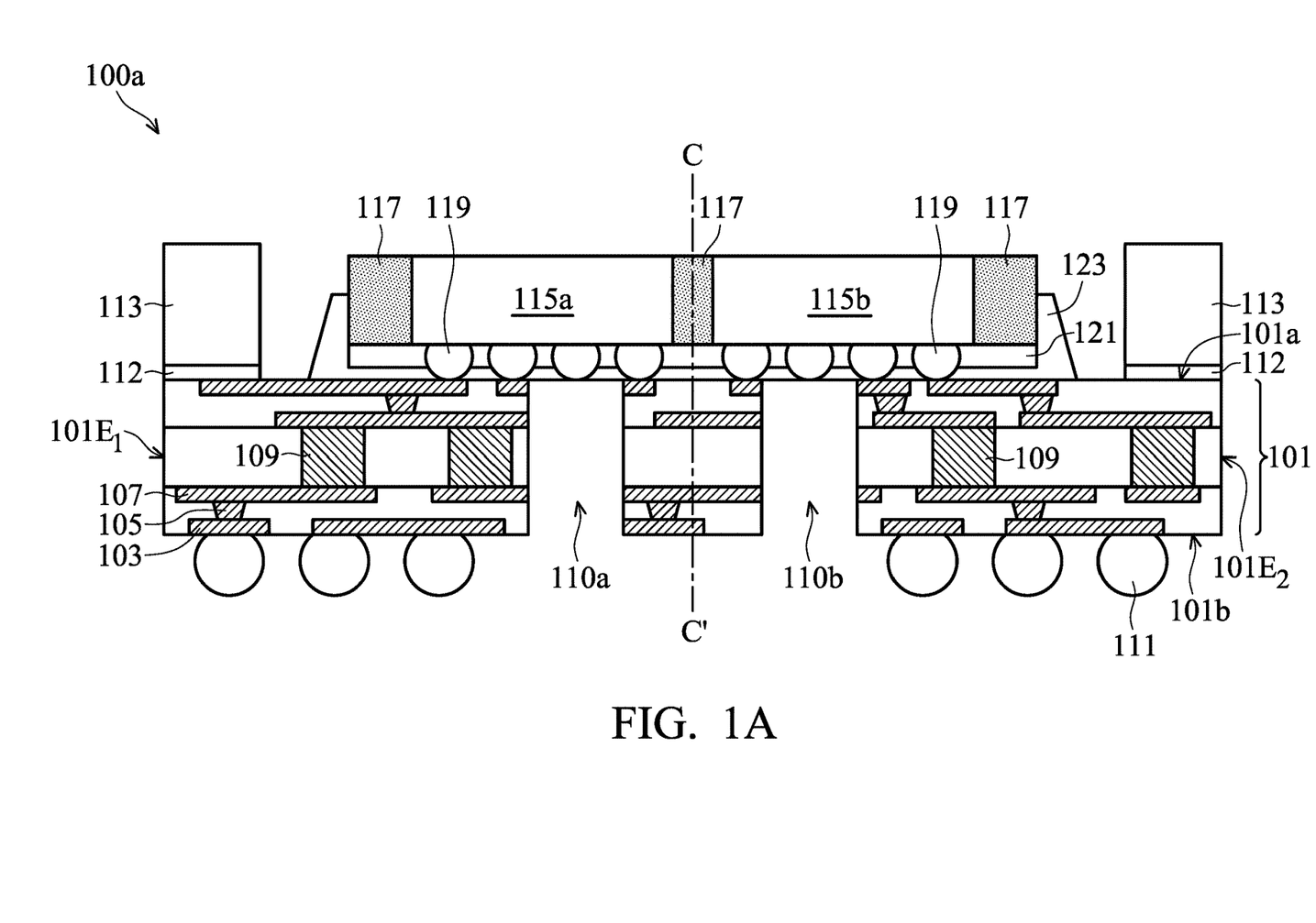
FIG. 1A is a cross-sectional view of a semiconductor package structure, in accordance with some embodiments of the disclosure.

FIG. 1A is a cross-sectional view of a semiconductor package structure 100a, in accordance with some embodiments of the disclosure. FIG. 1C is a plane view of an arrangement of holes in a substrate 101 of the semiconductor package structure 100a shown in FIG. 1A, and FIG. 1A is a cross-sectional view of the semiconductor package structure 100a along line I-I' of FIG. 1C.

Additional features can be added to the semiconductor package structure 100a. Some of the features described below can be replaced or eliminated for different embodiments. To simplify the diagram, only a portion of the semiconductor package structure 100a is depicted in FIGS. 1A and 1C. In some embodiments, the semiconductor package structure 100a may include a wafer-level semiconductor package, for example, a flip-chip semiconductor package.

Referring to FIG. 1, the semiconductor package structure 100a may be mounted on a base (not shown). In some embodiments, the semiconductor package structure 100a may be a system-on-chip (SOC) package structure. Moreover, the base may include a printed circuit board (PCB) and may be formed of polypropylene (PP). In some embodiments, the base may include a package substrate. The semiconductor package structure 100a is mounted on the base by a bonding process. For example, the semiconductor package structure 100a includes bump structures 111. In some embodiments, the bump structures 111 may be conductive ball structures (such as ball grid array (BGA)), conductive pillar structures, or conductive paste structures that are mounted on and electrically coupled to the base by the bonding process.

In the embodiment, the semiconductor package structure 100a includes a substrate 101. The substrate 101 has a wiring structure therein. In some embodiments, the wiring structure in the substrate 101 is a fan-out structure, and may include one or more conductive pads 103, conductive vias 105, conductive layers 107 and conductive pillars 109. In such cases, the wiring structure in the substrate 101 may be disposed in one or more inter-metal dielectric (IMD) layers. In some embodiments, the IMD layers may be formed of organic materials, which include a polymer base material, non-organic materials, which include silicon nitride ($SiN_x$), silicon oxide ($SiO_x$), graphene, or the like. For example, the IMD layers are made of a polymer base material. It should be noted that the number and configuration of the IMD layers, the conductive pads 103, the conductive vias 105, the conductive layers 107 and the conductive pillars 109 shown in Figures are only some examples and are not limitations to the present invention.

Moreover, the semiconductor package structure 100a also includes a first semiconductor die 115a and a second semiconductor die 115b bonded onto the substrate 101 through a plurality of conductive structures 119. The substrate 101 has a first surface 101a and a second surface 101b opposite thereto, the first surface 101a is facing the first semiconductor die 115a and the second semiconductor die 115b, and the second surface 101b is facing the above-mentioned base. The conductive structures 119 are disposed over the first surface 101a and below the first semiconductor die 115a and the second semiconductor die 115b, and the bump structures 111 are disposed over the second surface 101b of the substrate 101.

In some embodiments, the first semiconductor die 115a and the second semiconductor die 115b are electrically coupled to the bump structures 111 through the conductive structures 119 and the wiring structure in the substrate 101. In addition, the conductive structures 119 may be controlled collapse chip connection (C4) structures. It should be noted that the number of semiconductor dies integrated in the semiconductor package structure 100a is not limited to that disclosed in the embodiment.

In some embodiments, the first semiconductor die 115a and the second semiconductor die 115b are active devices. For example, the first semiconductor die 115a and the second semiconductor die 115b may be logic dies including a central processing unit (CPU), a graphics processing unit (GPU), a dynamic random access memory (DRAM) controller or any combination thereof. In some other embodiments, one or more passive devices are also bonded onto the substrate 101.

The first semiconductor die 115a and the second semiconductor dies 115b are arranged side-by-side. In some embodiments, the first semiconductor die 115a and the second semiconductor dies 115b are separated by a molding material 117. The molding material 117 surrounds the first semiconductor die 115a and the second semiconductor die 115b, and adjoins the sidewalls of the first semiconductor die 115a and the second semiconductor die 115b. In some embodiments, the molding material 117 includes a nonconductive material such as an epoxy, a resin, a moldable polymer, or another suitable molding material. In some embodiments, the molding material 117 is applied as a substantial liquid, and then is cured through a chemical reaction. In some other embodiments, the molding material 117 is an ultraviolet (UV) or thermally cured polymer applied as a gel or malleable solid, and then is cured through a UV or thermal curing process. The molding material 117 may be cured with a mold (not shown).

In some embodiments, the surfaces of the first semiconductor die 115a and the second semiconductor dies 115b facing away from the first surface 101a of the substrate 101 are exposed by the molding material 117, such that a heat dissipating device (not shown) can directly attached to the surfaces of the first semiconductor die 115a and the second semiconductor dies 115b. As a result, the heat-dissipation efficiency of the semiconductor package structure 100a can be improved, particularly for a large semiconductor package structure, such as 50 mm×50 mm, which is preferred for high power applications.

The semiconductor package structure 100a also includes a polymer material 121 disposed under the molding material 117, the first semiconductor die 115a and the second semiconductor die 115b, and between the conductive structures 119. The semiconductor package structure 100a further includes an underfill layer 123 interposed between the first surface 101a of the substrate 101 and the polymer material 121. In some embodiments, the first semiconductor die 115a, the second semiconductor dies 115b and the molding material 117 are surrounded by the underfill layer 123. The polymer material 121 and the underfill layer 123 are disposed to compensate for differing coefficients of thermal expansion (CTEs) between the substrate 101, the conductive structures 119, the first semiconductor die 115a and the second semiconductor dies 115b.

In addition, the semiconductor package structure 100a includes a frame 113 attached to the first surface 101a of the substrate 101 through an adhesive layer 112. The first semiconductor die 115a and the second semiconductor die 115b are surrounded by the frame 113 and the adhesive layer 112. In some embodiments, the frame 113 and the adhesive layer 112 are separated from the underfill layer 123 by a gap. The substrate 101 has a first edge $101E_1$ and a second edge $101E_2$ opposite thereto. In some embodiments, the first edge $101E_1$ and the second edge $101E_2$ are coplanar with sidewalls of the frame 113 and the adhesive layer 112.

Still referring to FIG. 1A, the substrate 101 of the semiconductor package structure 100a includes a first hole 110a and a second hole 110b formed on the second surface 101b.

In some embodiments, at least one of the first hole 110a and the second hole 110b penetrates through the substrate 101 from the first surface 101a to the second surface 101b. Although the first hole 110a and the second hole 110b shown in FIG. 1A penetrate through the substrate 101, in some other embodiments, both the first hole 110a and the second hole 110b do not penetrate through the substrate 101 from the first surface 101a to the second surface 101b. In some embodiments, the first hole 110a is covered by the first semiconductor die 115a, and the second hole 110b is covered by the second semiconductor die 115b. In other words, the first hole 110a is located within the projection of the first semiconductor die 115a on the substrate 101, and the second hole 110b is located within the projection of the second semiconductor die 115b on the substrate 101.

Specifically, the first semiconductor die 115a and the second semiconductor die 115b have a center line C-C' between them. The first hole 110a is disposed closer to the center line C-C' than the first edge 101E$_1$ of the substrate 101, and the second hole 110b is disposed closer to the center line C-C' than the second edge 101E$_2$ of the substrate 101. Although there are only two holes in the substrate 101 shown in FIG. 1A, it should be noted that there is no limitation on the number of the holes formed in the substrate 101.

In some embodiments, the first hole 110a and the second hole 110b are formed by a laser drilling process or another suitable process. It should be noted that the first hole 110a and the second hole 110b may be formed by the same forming process for the conductive pillars 109 in the wiring structure of the substrate 101. Moreover, the first semiconductor die 115a and the second semiconductor die 115b are bonded to the substrate 101 after forming the holes in the substrate 101. Therefore, the damage of the first semiconductor die 115a and the second semiconductor die 115b can be prevented.

Referring to FIG. 1C, which is a plane view of an arrangement of holes in a substrate 101 of the semiconductor package structure 100a shown in FIG. 1A, and FIG. 1A is a cross-sectional view of the semiconductor package structure 100a along line I-I' of FIG. 1C. It should be noted that FIG. 1C is the plane view from the bottom of the semiconductor package structure 100a. In other words, FIG. 1C is the plane view from the second surface 101b of the substrate 101, which the bump structures 111 are disposed on. In particular, the bump structures 111 are omitted for brevity.

As shown in FIG. 1C, the substrate 101 includes more than two holes. In particular, the substrate 101 further includes a third hole 110c and the fourth hole 110d formed on the second surface 101b. The third hole 110c is covered by the first semiconductor die 115a, and the fourth hole 110d is covered by the second semiconductor die 115b. It should be noted that the substrate 101 has a center 101C, and the first hole 110a, the second hole 110b, the third hole 110c, and the fourth hole 110d are disposed closer to the center 101C than the first edge 101E$_1$ and the second edge 101E$_2$ of the substrate 101.

The holes formed in the substrate 101, for example, the first hole 110a, the second hole 110b, the third hole 110c and the fourth hole 110d, are designed to release the stress in the substrate 101, especially the stress concentrated in the region below the interface between two semiconductor dies (i.e. the first semiconductor die 115a and the second semiconductor die 115b). Since the semiconductor package structure 100a may be highly stressed due to the different coefficients of thermal expansion (CTEs) of the substrate 101 and the semiconductor dies, the holes formed in the substrate 101 can solve the warping or cracking problems caused by mismatched CTEs. As a result, the electrical connection within the semiconductor package structure 100a may not be damaged, and the reliability of the semiconductor package structure 100a may be increased.

Figure 1B:
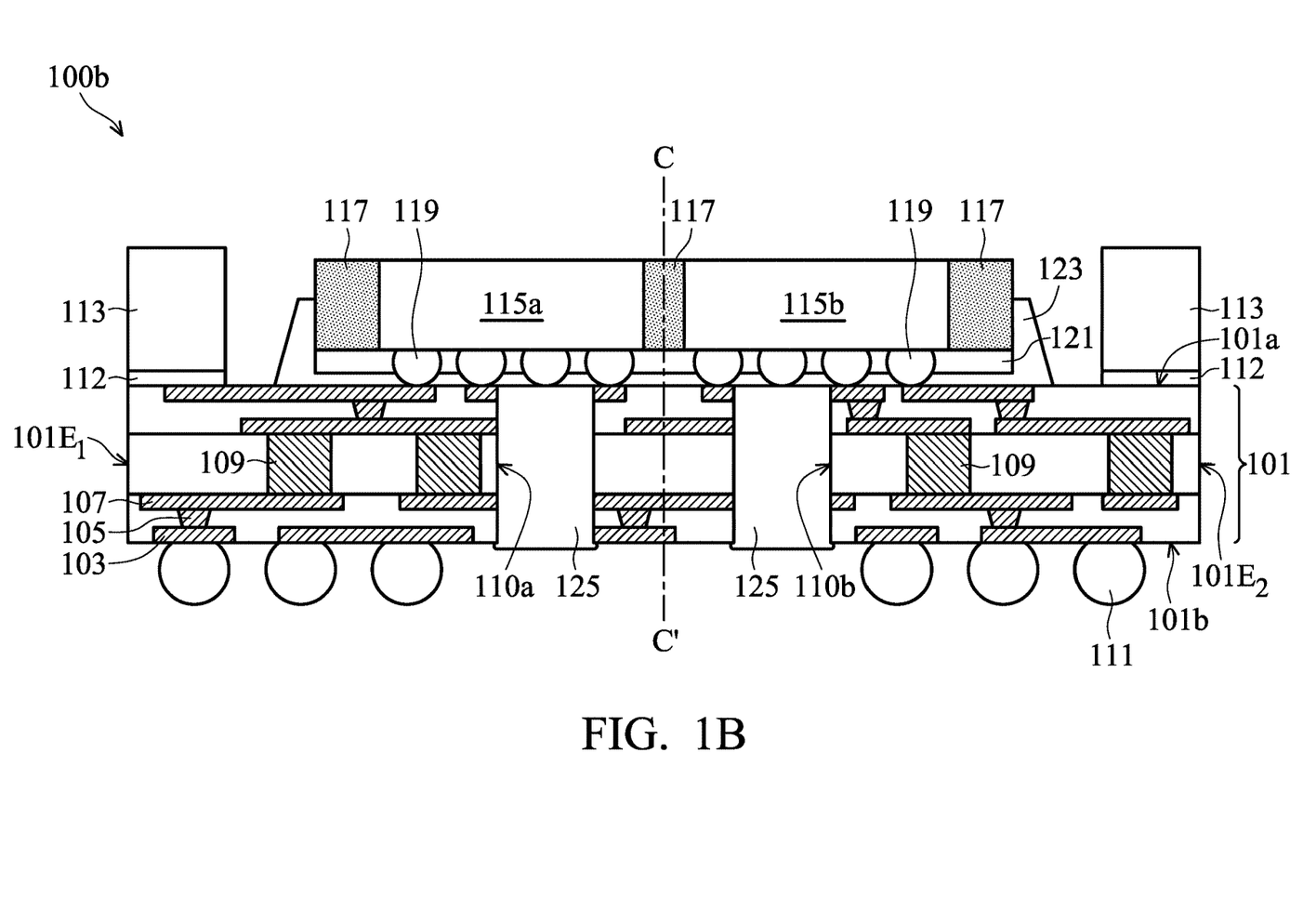
FIG. 1B is a cross-sectional view of a semiconductor package structure, in accordance with some other embodiments of the disclosure.
Figure 1C:
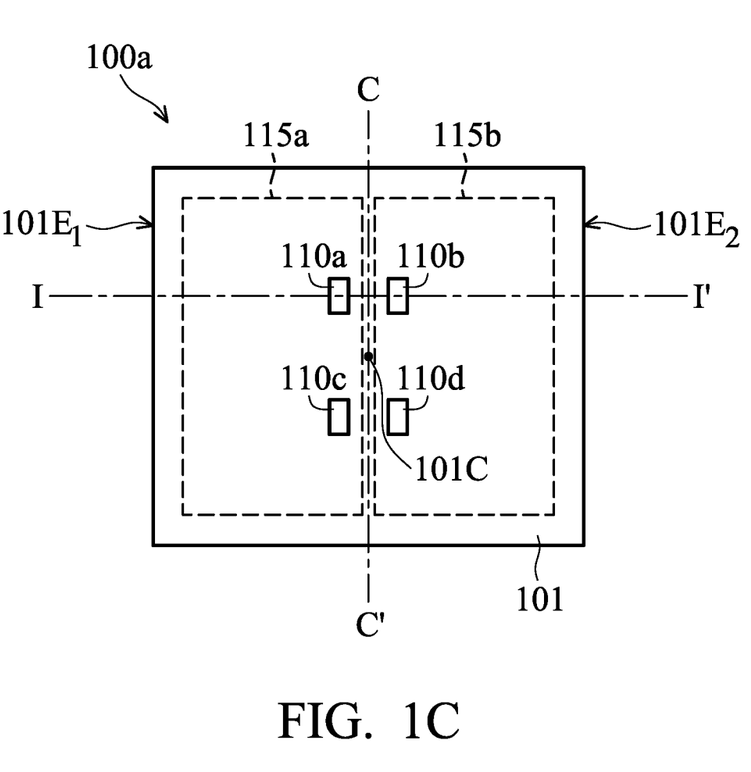

FIG. 1B is a cross-sectional view of a semiconductor package structure 100b, in accordance with some other embodiments of the disclosure. Descriptions of elements of the embodiments hereinafter that are the same as or similar to those previously described with reference to FIG. 1A are omitted for brevity.

As shown in FIG. 1B, the semiconductor package structure 100b includes a stress buffer layer 125 filled in the first hole 110a and the second hole 110b. The stress buffer layer 125 is made of a polymer material, such as a silicone resin or rubber. In some embodiments, the stress buffer layer 125 is made of an organic resin, such as Ajinomoto Build-up Film (ABF).

Moreover, the stress buffer layer 125 may be formed by a spin coating process. In some other embodiments, a material of the stress buffer layer 125 may be dispensed in the first hole 110a and the second hole 110b, and an excess portion of the material of the stress buffer layer 125 may be removed. In some embodiments, the stress buffer layer 125 may be formed before bonding the first semiconductor die 115a and the second semiconductor die 115b to the substrate 101.

In some embodiments, the stress buffer layer 125 may filled up the first hole 110a and the second hole 110b, and the surfaces of the stress buffer layer 125 are level with the second surface 101b of the substrate 101. In some other embodiments, the surfaces of the stress buffer layer 125 may not be level with the second surface 101b of the substrate 101 according to the actual manufacturing processes.

Filling the first hole 110a and the second hole 110b with the stress buffer layer 125 may offer advantages like preventing the impurities and dusts from dropping into the first hole 110a and the second hole 110b during the handling process of the substrate 101. In addition, the warping or cracking problems caused by mismatched coefficients of thermal expansion in the semiconductor package structure 100b can be solved by the holes (including the first hole 110a and the second hole 110b) and the stress buffer layer 125 formed in the substrate 101. Accordingly, the electrical connection within the semiconductor package structure 100b may not be damaged, and the lifespan of the semiconductor package structure 100b may be increased.

Figure 2A:
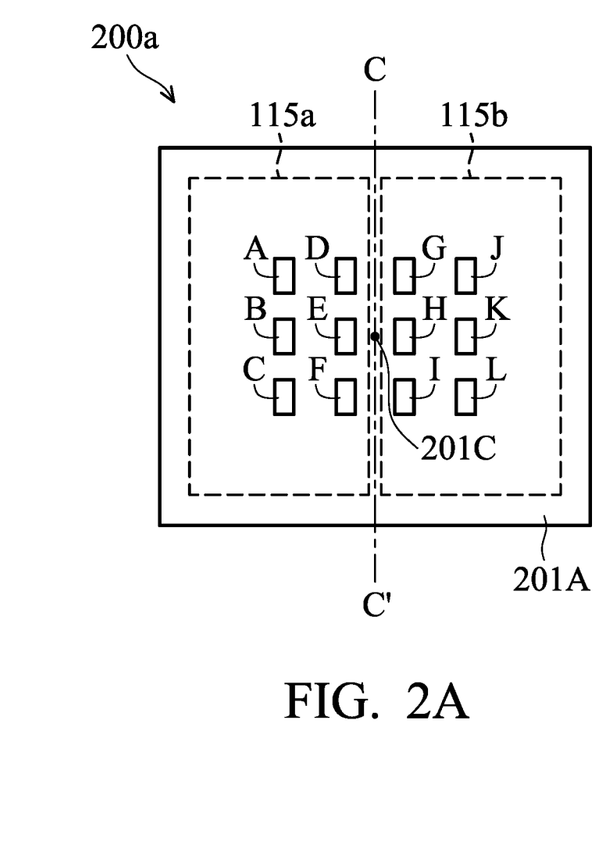
FIGS. 2A-2B are plane views showing shapes of holes in substrates of semiconductor package structures, in accordance with some embodiments of the disclosure.
Figure 2B:
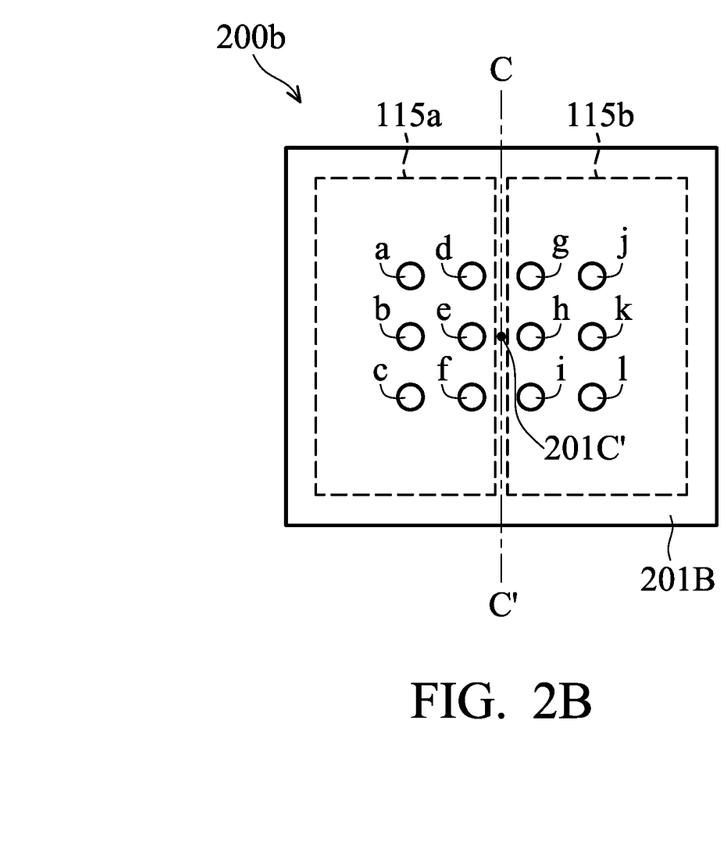

FIG. 2A is a plane view showing shapes of holes in a substrate 201A of a semiconductor package structure 200a, and FIG. 2B is a plane view showing shapes of holes in a substrate 201B of a semiconductor package structure 200b, in accordance with some embodiments of the disclosure. Descriptions of elements of the embodiments hereinafter that are the same as or similar to those previously described with reference to FIG. 1C are omitted for brevity.

Referring to FIG. 2A, the semiconductor package structure 200a has holes A, B, C, D, E, F, G, H, I, J, K and L in the substrate 201A, and the number of holes in the substrate 201A is much more than that in the substrate 101 of the semiconductor package structure 100a. As shown in FIG. 2A, the holes A, B, C, D, E and F are covered by the first semiconductor die 115a, and the holes G, H, I, J, K and L are covered by the second semiconductor die 115b. In other words, the holes A-F are located within the projection of the first semiconductor die 115a on the substrate 201A, and the holes G-L are located within the projection of the second semiconductor die 115b on the substrate 201A.

Specifically, the holes A, B and C are arranged in a first array, the holes D, E and F are arranged in a second array, the holes G, H and I are arranged in a third array, and the holes J, K and L are arranged in a fourth array. The first array, the second array, the third array and the fourth array are parallel to the center line C-C' of the first semiconductor die 115a and the second semiconductor die 115b.

Referring to FIG. 2B, the substrate 201B in the semiconductor package structure 200b has holes a, b, c, d, e, f, g, h, i, j, k and 1, which are arranged in the same way as the holes A-L of the substrate 201A in the semiconductor package structure 200a. The difference between the substrate 201A and the substrate 201B is that the holes a-l have circular shapes in the plane view. Compared with the holes A-L in the substrate 201A, which have rectangular shapes in the plane view, the problems of stress concentrated at the corners of the holes A-L can be prevented in the substrate 201B due to the round shapes of the holes a-l. Therefore, the probability that the cracking problem occurs in the substrate 201B of the semiconductor package structure 200b can be more decreased.

In some embodiments, stress buffer layers may be optionally formed in the holes A-L of the semiconductor package structure 200a and in the holes a-l of the semiconductor package structure 200b. It should be noted that the holes A-L are symmetrically located about the center line C-C' in the plane view of FIG. 2A, and the holes a-l are symmetrically located about the center line C-C' in the plane view of FIG. 2B. In some other embodiments, the holes A-L are symmetrically located about the center 201C of the substrate 201A in the plane view of FIG. 2A, and the holes a-l are symmetrically located about the center 201C' of the substrate 201B in the plane view of FIG. 2B.

Figure 3A:
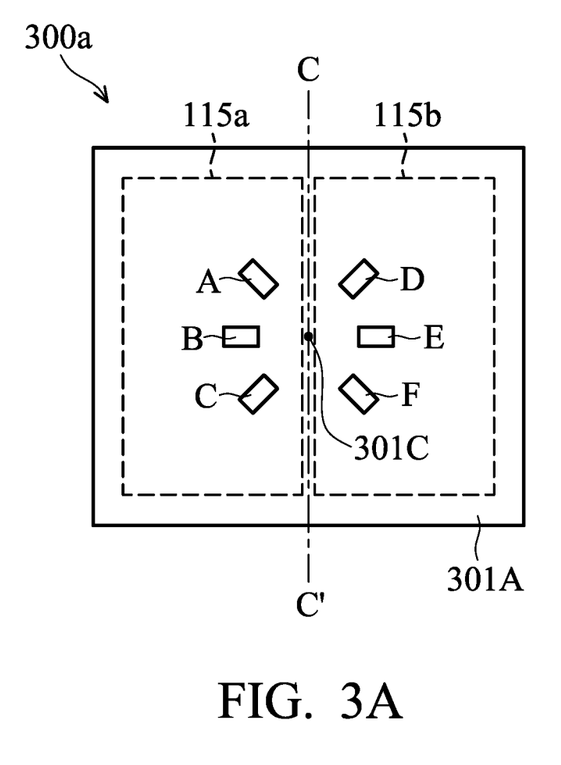
FIGS. 3A-3B are plane views showing arrangements of holes in substrates of semiconductor package structures, in accordance with some embodiments of the disclosure.
Figure 3B:
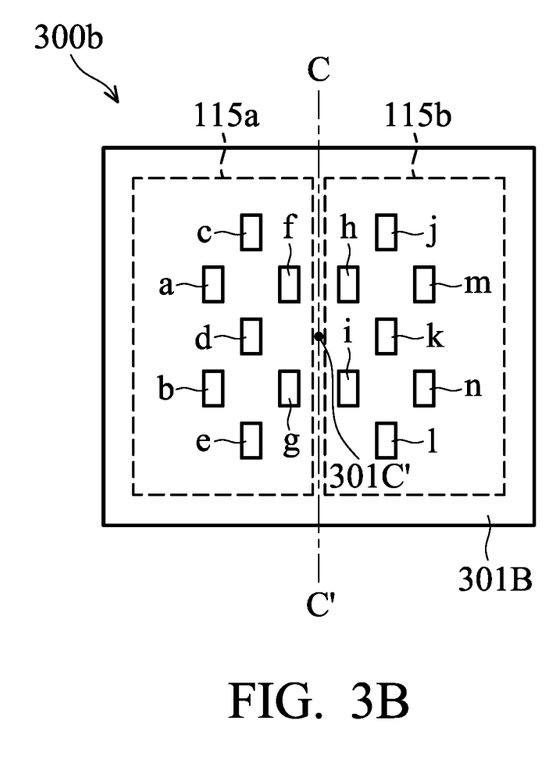

FIG. 3A is a plane view showing arrangements of holes in a substrate 301A of a semiconductor package structure 300a, and FIG. 3B is a plane view showing arrangements of holes in a substrate 301B of a semiconductor package structure 300b, in accordance with some embodiments of the disclosure. Descriptions of elements of the embodiments hereinafter that are the same as or similar to those previously described with reference to FIG. 2A are omitted for brevity.

Referring to FIG. 3A, the semiconductor package structure 300a has holes A, B, C, D, E, and F in the substrate 301A. The holes A, B and C are covered by the first semiconductor die 115a, and the holes D, E and F are covered by the second semiconductor die 115b. In other words, the holes A-C are located within the projection of the first semiconductor die 115a on the substrate 301A, and the holes D-F are located within the projection of the second semiconductor die 115b on the substrate 301A.

It should be noted that the holes A-F are arranged radially around the center 301C of the substrate 301A. In some other embodiments, the holes A-F are arranged radially around a center, and the center is located between the first semiconductor die 115a and the second semiconductor die 115b.

Compared with the semiconductor package structure 200a of FIG. 2A, the stress in the substrate 301A of the semiconductor package structure 300a, which has holes A-F arranged radially, can be released more efficiently. In other words, in order to obtain the same stress releasing effect as in the semiconductor package structure 200a, the number of the holes in the substrate 301A of the semiconductor package structure 300a can be less than the number of the holes in the substrate 201A of the semiconductor package structure 200a. However, the substrate 201A of the semiconductor package structure 200a, which has holes A-L arranged parallel to the center line C-C', is more easily to be manufactured than the substrate 301A of the semiconductor package structure 300a, which has holes A-F arranged radially.

Referring to FIG. 3B, the substrate 301B in the semiconductor package structure 300b has holes a, b, c, d, e, f, g, h, i, j, k, 1, m and n arranged staggered in the substrate 301B. Specifically, the holes a-g are covered by the first semiconductor die 115a and staggered disposed along the direction of the center line C-C', and the holes h-n are covered by the second semiconductor die 115b and staggered disposed along the direction of the center line C-C'.

Compared with the semiconductor package structure 200a in FIG. 2A and the semiconductor package structure 300a in FIG. 3A, the substrate 301B of the semiconductor package structure 300b can combine the above-mentioned benefits of the hole arrangements of the substrate 201A in the semiconductor package structure 200a and the substrate 301A of the semiconductor package structure 300a. Specifically, the holes a-n in the substrate 301B can be manufactured easily, and the stress in the substrate 301B can be released efficiently.

In some embodiments, stress buffer layers may optionally be formed in the holes A-F of the semiconductor package structure 300a and the holes a-n of the semiconductor package structure 300b. It should be noted that the holes A-F are symmetrically located about the center line C-C' in the plane view of FIG. 3A, and the holes a-n are symmetrically located about the center line C-C' in the plane view of FIG. 3B. In some other embodiments, the holes A-F are symmetrically located about the center 301C of the substrate 301A in the plane view of FIG. 3A, and the holes a-n are symmetrically located about the center 301C' of the substrate 301B in the plane view of FIG. 3B.

Figure 4A:
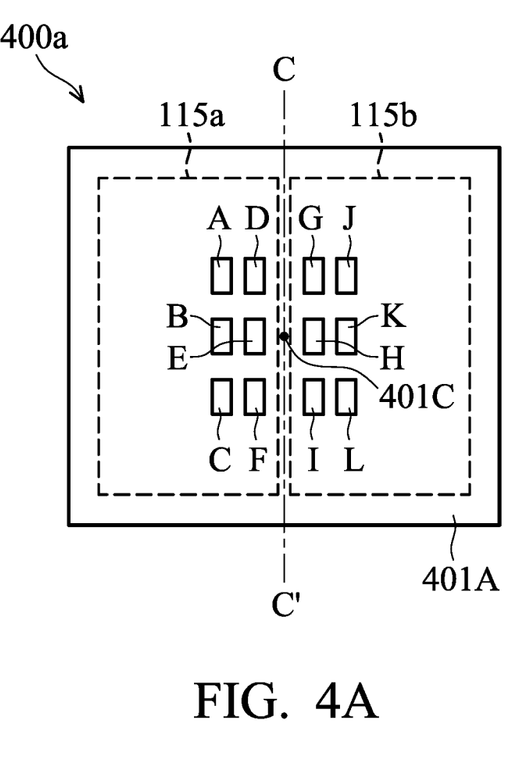
FIGS. 4A-4B are plane views showing locations of holes in substrates of semiconductor package structures, in accordance with some embodiments of the disclosure.
Figure 4B:
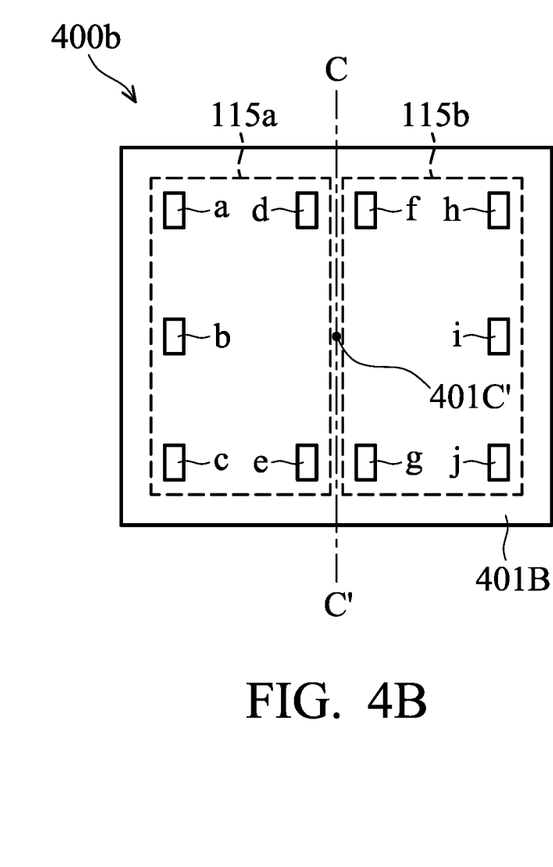

FIG. 4A is a plane view showing locations of holes in a substrate 401A of a semiconductor package structure 400a, and FIG. 4B is a plane view showing locations of holes in a substrate 401B of a semiconductor package structure 400b, in accordance with some embodiments of the disclosure. Descriptions of elements of the embodiments hereinafter that are the same as or similar to those previously described with reference to FIG. 2A are omitted for brevity.

Referring to FIG. 4A, the substrate 401A in the semiconductor package structure 400a has holes A, B, C, D, E, F, G, H, I, J, K and L arranged in the same way as the holes A-L of the substrate 201A in the semiconductor package structure 200a shown in FIG. 2A. The holes A-L are arranged parallel to the center line C-C' in the substrate 401A. The difference between FIGS. 2A and 4A is that the holes A-L in the substrate 401A are located closer to the center 401C of the substrate 401A than the holes A-L in the substrate 201A.

Since the maximum stress is likely to be concentrated at the center 401C of the substrate 401A, the stress in the substrate 401A of the semiconductor package structure 400a, which has holes A-L located closer to the center 401C of the substrate 401A, can be released more efficiently than the semiconductor package structure 200a.

Referring to FIG. 4B, the substrate 401B in the semiconductor package structure 400b has holes a, b, c, d, e, f, g, h, i and j located along the peripheral edge of the substrate 401B. In other words, the holes a-j are located far from the center 401C' of the substrate 401B to reserve space in the middle of the substrate 401B for routing. Compared with the semiconductor substrate 400a of FIG. 4A, the semiconductor substrate 400b of FIG. 4B can provide a better routing capability for the substrate 401B.

In some embodiments, stress buffer layers may optionally be formed in the holes A-L of the semiconductor package structure 400a and the holes a-j of the semiconductor package structure 400b. It should be noted that the holes A-L are symmetrically located about the center line C-C' in the plane view of FIG. 4A, and the holes a-j are symmetrically located about the center line C-C' in the plane view of FIG. 4B. In some other embodiments, the holes A-L are symmetrically located about the center 401C of the substrate 401A in the plane view of FIG. 4A, and the holes a-j are symmetrically located about the center 401C' of the substrate 401B in the plane view of FIG. 4B.

According to the foregoing embodiments, the holes formed in the substrate are designed to release the stress in the substrate, especially the stress concentrated in the region below the interface between two semiconductor dies. Since the semiconductor package structure may be highly stressed due to the different coefficients of thermal expansion (CTEs) of the substrate and the semiconductor dies, the holes formed in the substrate can solve the warping or cracking problems caused by mismatched CTEs. As a result, the electrical connection within the semiconductor package structure may not be damaged, and the reliability and the lifespan of the semiconductor package structure may be increased.

Many variations and/or modifications can be made to embodiments of the disclosure. The semiconductor package structures in accordance with some embodiments of the disclosure can be used to form a three-dimensional (3D) package, a 2.5D package, a fan-out package, or another suitable package. In addition, the arrangements, the shapes, and the locations of the holes in the substrate can be adjusted according to the types of the application.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a substrate having a first surface and a second surface opposite thereto, wherein the substrate comprises a wiring structure;
   a first semiconductor die disposed over the first surface of the substrate and electrically coupled to the wiring structure;
   a second semiconductor die disposed over the first surface of the substrate and electrically coupled to the wiring structure, wherein the first semiconductor die and the second semiconductor die are separated by a molding material;
   a first hole and a second hole formed on the second surface of the substrate; and
   a frame disposed over the first surface of the substrate, wherein the frame surrounds the first semiconductor die and the second semiconductor die.

2. The semiconductor package structure as claimed in claim 1, wherein the first hole is covered by the first semiconductor die, and the second hole is covered by the second semiconductor die.

3. The semiconductor package structure as claimed in claim 1, wherein the first hole and the second hole are disposed closer to a center line between the first semiconductor die and the second semiconductor die than an edge of the substrate.

4. The semiconductor package structure as claimed in claim 1, wherein the first hole and the second hole have rectangular shapes or circular shapes from a plane view.

5. The semiconductor package structure as claimed in claim 1, further comprising:
   a third hole and a fourth hole formed on the second surface of the substrate, wherein the third hole is covered by the first semiconductor die, and the fourth hole is covered by the second semiconductor die, and
   wherein the first hole, the second hole, the third hole and the fourth hole are arranged radially around a center of the substrate.

6. The semiconductor package structure as claimed in claim 1, further comprising:
   a third hole and a fourth hole formed on the second surface of the substrate, wherein the third hole is covered by the first semiconductor die, and the fourth hole is covered by the second semiconductor die, and
   wherein the first hole and the third hole are arranged in a first array, and the second hole and the fourth hole are arranged in a second array, the first array and the second array are parallel to a center line between the first semiconductor die and the second semiconductor die.

7. The semiconductor package structure as claimed in claim 6, further comprising:
   a fifth hole and a sixth hole formed on the second surface of the substrate, wherein the fifth hole is covered by the first semiconductor die, and the sixth hole is covered by the second semiconductor die, and
   wherein the first hole, the third hole and the fifth hole are staggered along a direction of the center line, and the second hole, the fourth hole and the sixth hole are staggered along the direction of the center line.

8. The semiconductor package structure as claimed in claim 1, further comprising:
   a plurality of conductive structures disposed over the first surface and below the first semiconductor die and the second semiconductor die; and
   a plurality of bump structures disposed over the second surface of the substrate, wherein the first semiconductor die and the second semiconductor die are electrically coupled to the bump structures through the conductive structures and the wiring structure in the substrate.

9. The semiconductor package structure as claimed in claim 1, wherein the molding material further surrounds the first semiconductor die and the second semiconductor die, and surfaces of the first semiconductor die and the second semiconductor die facing away from the substrate are exposed by the molding material.

10. The semiconductor package structure as claimed in claim 1, further comprising:
    a stress buffer layer filled into the first hole and the second hole.

* * * * *